United States Patent
Siniaguine et al.

(10) Patent No.: US 6,322,903 B1
(45) Date of Patent: Nov. 27, 2001

(54) PACKAGE OF INTEGRATED CIRCUITS AND VERTICAL INTEGRATION

(75) Inventors: Oleg Siniaguine; Sergey Savastiouk, both of San Jose, CA (US)

(73) Assignee: Tru-Si Technologies, Inc., Sunnyvale, CA (US)

( * ) Notice: Subject to any disclaimer, the term of this patent is extended or adjusted under 35 U.S.C. 154(b) by 0 days.

(21) Appl. No.: 09/456,225

(22) Filed: Dec. 6, 1999

(51) Int. Cl.[7] .................................................. H01L 21/44
(52) U.S. Cl. .......................... 428/617; 438/108; 438/459; 438/977
(58) Field of Search ..................................... 438/616, 617, 438/118, 107, 112, 108, 113, 615, 119, 618, 315, 455–459, 598, 599

(56) References Cited

U.S. PATENT DOCUMENTS

| | | | |
|---|---|---|---|
| 3,810,129 | 5/1974 | Behman et al. | 340/173 DR |
| 3,811,117 | 5/1974 | Anderson, Jr. et al. | 340/173 DR |
| 3,881,884 | 5/1975 | Cook et al. | 29/290 |
| 3,993,917 | 11/1976 | Kalter | 307/235 |
| 4,368,106 | 1/1983 | Anthony | 204/15 |
| 4,394,712 | 7/1983 | Anthony | 361/411 |
| 4,463,336 | 7/1984 | Black et al. | 338/4 |
| 4,467,518 | 8/1984 | Bansal et al. | 29/571 |
| 4,603,341 | 7/1986 | Bertin et al. | 357/23.7 |
| 4,612,083 | 9/1986 | Yasumoto et al. | 156/633 |
| 4,628,174 | 12/1986 | Anthony | 219/76 |
| 4,722,130 | 2/1988 | Kimura et al. | 29/413 |
| 4,769,738 | 9/1988 | Nakamura et al. | 361/283 |
| 4,807,021 | 2/1989 | Okumura | 357/75 |

(List continued on next page.)

FOREIGN PATENT DOCUMENTS

| | | |
|---|---|---|
| 19707887A1 | 9/1998 | (DE) . |
| 0807964 A1 | 11/1995 | (EP) . |
| 0698288 B1 | 2/1996 | (EP) . |
| 0757431 A2 | 7/1996 | (EP) . |
| WO 92/03848 | 3/1992 | (WO) . |
| WO 94/09513 | 4/1994 | (WO) . |
| WO 94/25981 | 11/1994 | (WO) . |
| WO 96/21943 | 7/1996 | (WO) . |
| WO 97/45856 | 12/1997 | (WO) . |
| WO 97/45862 | 12/1997 | (WO) . |
| WO 98/19337 | 5/1998 | (WO) . |

OTHER PUBLICATIONS

Christensen, C., et al. "Wafer Through–Hole Interconnections with High Vertical Wiring Densities", *IEEE Trans. On Comp., Pkg.& Mfg. Tech*, Part A, vol. 19, No. 4, Dec. 1996, pp. 516–521.

Anthony, T., "Forming Feedthroughs in Laser–Drilled Holes in Semiconductor Wafers by Double–Sided Sputtering", *IEEE Trans. On Comp., Hybrids,& Mfg. Tech*, vol. CHMT–5, No. 1, Mar. 1982, pp. 171–180.

Agrikov, U. et al "Dynamical Plasma Treatment of HIC (Hybrid Integrated Circuits) Substrates", Electronic Techniques, Ser. 10, Microelectronic Devices 5(71), 1988, pp. 30–32, Russia.

(List continued on next page.)

*Primary Examiner*—Charles Bowers
*Assistant Examiner*—Yennhu B. Huynh
(74) *Attorney, Agent, or Firm*—Skjerven Morrill MacPherson, LLP; Michael Shenker

(57) ABSTRACT

A first level packaging wafer is made of a semiconductor or insulating material. The bumps on the wafer are made using vertical integration technology, without solder or electroplating. More particularly, vias are etched part way into a first surface of the substrate. Metal is deposited into the vias. Then the substrate is blanket-etched from the back side until the metal is exposed and protrudes from the vias to form suitable bumps. Dicing methods and vertical integration methods are also provided. Solder or electroplating are used in some embodiments.

29 Claims, 13 Drawing Sheets

U.S. PATENT DOCUMENTS

| | | | |
|---|---|---|---|
| 4,842,699 | 6/1989 | Hua et al. | 204/15 |
| 4,890,784 | 1/1990 | Bampton | 228/194 |
| 4,897,708 | 1/1990 | Clements | 357/65 |
| 4,954,458 | 9/1990 | Reid | 437/51 |
| 4,978,639 | 12/1990 | Hua et al. | 437/230 |
| 4,996,587 | 2/1991 | Hinrichsmeyer et al. | 357/74 |
| 5,064,771 | 11/1991 | Solomon | 437/3 |
| 5,071,792 | 12/1991 | VanVonno et al. | 437/227 |
| 5,160,987 | 11/1992 | Pricer et al. | 257/307 |
| 5,166,097 | 11/1992 | Tanielian | 437/203 |
| 5,191,405 | 3/1993 | Tomita et al. | 257/777 |
| 5,225,771 | 7/1993 | Leedy | 324/158 |
| 5,258,330 | 11/1993 | Khandros et al. | 437/209 |
| 5,270,261 | 12/1993 | Bertin et al. | 347/209 |
| 5,307,942 | 5/1994 | Quelfeter et al. | 211/26 |
| 5,309,318 | 5/1994 | Beilstein, Jr. et al. | 361/689 |
| 5,313,097 | 5/1994 | Haj-Ali-Ahmadi et al. | 257/706 |
| 5,314,844 | 5/1994 | Imamura | 437/226 |
| 5,322,816 | 6/1994 | Pinter | 437/203 |
| 5,323,035 | 6/1994 | Leedy | 257/248 |
| 5,340,771 | 8/1994 | Rostoker | 437/209 |
| 5,380,681 | 1/1995 | Hsu | 437/209 |
| 5,399,898 | 3/1995 | Rostoker | 257/499 |
| 5,414,637 | 5/1995 | Bertin et al. | 364/489 |
| 5,426,566 | 6/1995 | Beilstein, Jr. et al. | 361/735 |
| 5,453,404 | 9/1995 | Leedy | 437/203 |
| 5,463,246 | 10/1995 | Matsunami | 257/621 |
| 5,466,634 | 11/1995 | Beilstein, Jr. et al. | 437/189 |
| 5,467,305 | 11/1995 | Bertin et al. | 365/185.01 |
| 5,468,663 | 11/1995 | Bertin et al. | 437/43 |
| 5,478,781 | 12/1995 | Bertin et al. | 437/209 |
| 5,489,554 | 2/1996 | Gates | 437/208 |
| 5,494,832 | 2/1996 | Lehmann et al. | 437/2 |
| 5,502,333 | 3/1996 | Bertin et al. | 257/685 |
| 5,502,667 | 3/1996 | Bertin et al. | 365/51 |
| 5,506,753 | 4/1996 | Bertin et al. | 316/705 |
| 5,517,057 | 5/1996 | Beilstien, Jr. et al. | 257/686 |
| 5,517,754 | 5/1996 | Beilstein, Jr. et al. | 29/840 |
| 5,532,519 | 7/1996 | Bertin et al. | 257/777 |
| 5,550,942 | 8/1996 | Sheem | 385/53 |
| 5,561,622 | 10/1996 | Bertin et al. | 365/51 |
| 5,563,086 | 10/1996 | Bertin et al. | 437/52 |
| 5,567,653 | 10/1996 | Bertin et al. | 437/173 |
| 5,567,654 | 10/1996 | Beilstein, Jr. et al. | 437/209 |
| 5,571,754 | 11/1996 | Bertin et al. | 437/209 |
| 5,596,226 | 1/1997 | Beilstein, Jr. et al. | 257/690 |
| 5,621,106 * | 4/1997 | Hsu | 438/459 |
| 5,654,127 | 8/1997 | Leedy | 430/315 |
| 5,684,330 | 11/1997 | Lee | 257/692 |
| 5,742,100 | 4/1998 | Schroeder et al. | 257/778 |
| 5,759,873 | 6/1998 | Kata et al. | 438/118 |
| 5,786,271 | 7/1998 | Ohida et al. | 438/615 |
| 5,798,567 | 8/1998 | Kelly et al. | 257/723 |
| 5,817,541 | 10/1998 | Averkiou et al. | 438/107 |
| 5,831,832 | 11/1998 | Gillette et al. | 361/760 |
| 5,834,830 | 11/1998 | Cho | 257/667 |
| 5,843,844 | 12/1998 | Miyanaga | 438/694 |
| 5,858,815 | 1/1999 | Heo et al. | 438/112 |
| 5,862,816 | 1/1999 | Cho | 438/123 |
| 5,863,812 | 1/1999 | Manteghi | 438/108 |
| 5,872,051 | 2/1999 | Fallon et al. | 438/616 |
| 5,879,964 | 3/1999 | Paik et al. | 438/113 |
| 5,886,398 | 3/1999 | Low et al. | 257/667 |
| 5,889,332 | 3/1999 | Lawson et al. | 257/778 |
| 5,892,273 | 4/1999 | Iwasaki et al. | 257/690 |
| 5,892,290 | 4/1999 | Chakravorty et al. | 257/786 |
| 5,918,113 | 6/1999 | Higashi et al. | 438/119 |
| 5,998,292 | 12/1999 | Black et al. | 438/618 |
| 6,083,773 * | 7/2000 | Lake | 438/108 |

OTHER PUBLICATIONS

IPEC Precision brochure for PACEJET II (© 1996 ), 2 pages.

Siniaguine, Oleg, "Plasma Jet Etching at Atomspheric Pressure for Semiconductor Production", First Int'l Symposium on Plasma Process–Induced Damage, May 13–14, 1996, Santa Clara, CA, pp 151–153.

AZ Corporation, "Plasma Jet Etching Technology and Equipment; Silicon Wafer Thinning & Isotropical Etching at Atomspheric Pressure", Semicon/Europe, Apr. 1995, Geneva, Switzerland, 4 pages.

M. Amagai, et al., "Development of Chip Scale Packages (CSP) for Center Pad Devices", 1997 Electronic Components and Technology Conference, 1997 IEEE, pp 343–352.

P. Elenius, "Flex on Cap —Solder Paste Bumping", 1997 Electronic Components and Technology Conference, 1997 IEEE, pp. 248–252.

R. Fillion, et al., "Chip Scale Packaging Using Chip–on–Flex Technology", 1997 Electronic Components and Technology Conference, 1997 IEEE, pp. 638–641.

J. Kloeser et al. "Fine Pitch Stencil Printing of Sn/Pb and Lead Free Solders for Flip Chip Technology", 1997 Electronic Components and Technology Conference, 1997 IEEE, pp. 254–263.

L. Levine, "Ball Bumping and Coining Operations for Tab and Flip Chip", 1997 Electronic Components and Technology Conference, 1997 IEEE, pp. 265–273.

Sara M. Chen, "Electroplated Hermetic Fiber", 1998 Electronic Conference, 1998 IEEE, p. 418.

L. Li, et al., "Stencil Printing Process Developing for Low Cost Flip Chip Interconnect", 1998 Electronic Components and Technology Conference, 1998 IEEE, pp. 421–426.

G. Rinne, "Solder Bumping Methods for Flip Chip Packaging", 1997 Electronic Components and Technology Conference, 1997 IEEE, pp. 241–247.

K. Shimokawa, et al, "Micro–ball Bump for Flip Interconnections", 1998 Electronic Components and Technology Conference, 1998 IEEE, pp. 1472–1476.

Y.C. Teo, "Low Cost Chip–Scale Package", 1997 Electronic Components and Technology Conference, 1997 IEEE, pp. 358–363.

Y. Yamaji, et al., "Development of Highly Reliable CSP", 1997 Electronic Components and Technology Conference, 1997 IEEE, pp. 1022–1027.

* cited by examiner

PACKAGE OF INTEGRATED CIRCUITS AND VERTICAL INTEGRATION

BACKGROUND OF THE INVENTION

The present invention relates to semiconductor circuits, and more particularly to integrated circuit packaging and to vertical integrated circuits.

Integrated circuits are typically attached to a wiring substrate, for example, a printed circuit board (PCB), for easy connection to other circuits. Attachment can be done using flip-chip technology. According to this technology, conductive bumps are formed on the contact pads of the chip (die) incorporating the circuit. The bumps can be made by growing solder on the contact pads or by electroplating gold or some other material. Then the chip is bonded with its bumps to the wiring substrate.

Sometimes, the contacts on the wiring substrate cannot be made with the same precision as the contacts on the chip. For example, typical PCB fabrication technology is not as precise as semiconductor fabrication technology used for chip fabrication. Therefore, the chip contacts have to be made larger, and spaced farther from each other, to accommodate PCB fabrication technology.

Another reason why the chip contacts cannot be made as dense as allowed by the semiconductor fabrication technology is large tolerances required by many bumping processes.

This problem is exacerbated by the fact that the chip contacts placement is sometimes restricted by the layout of the chip circuitry. For example, many chips have their contacts restricted to the peripheral area. This makes it more difficult to accommodate larger widely spaced contacts as required by the PCB technology and bumping processes.

Therefore, sometimes a chip is bonded to a molded plastic substrate, which is bonded to the PCB. The plastic substrate can be larger than the chip, or it can have the same size. On the plastic substrate, the position of the contacts bonded to the PCB is not as limited as on the chip. For example, the contacts can be evenly distributed on the plastic substrate's surface bonded to the PCB (so-called "area matched package").

Alternative packaging techniques are desirable.

SUMMARY

In some embodiments of the present invention, the intermediate substrate between a chip and a wiring substrate is made using techniques common in semiconductor fabrication technology. In particular, the substrate can be made from a semiconductor material (for example, silicon) or insulating polymer. The substrate has contacts both on the side connected to the chip and on the side connected to the PCB. These contacts are made using techniques similar to those used for vertical integration. See, for example, PCT publication WO 98/19337 "Integrated Circuits and Methods for Their Fabrication" (TruSi Technologies, LLC, 1998).

In some embodiments, the intermediate substrate (the "packaging" substrate) includes additional circuitry.

In some embodiments, a fabrication method comprises forming one or more vias in a first side of a first substrate. A conductive contact is formed in each of the vias so that each contact is not exposed on a second side of the first substrate. Then a blanket process exposes each contact on the second side. The blanket process includes removing material from the second side. The blanket process causes each contact to protrude from the second side. At least one contact on the second side is bonded to a wiring substrate so that the first substrate or a portion thereof becomes directly attached to the wiring substrate.

According to another aspect of the invention, a method for fabricating a vertical integrated circuit comprises providing a vertically integrated stack of structures M(1), . . . M(N), wherein each structure comprises one or more contacts directly attached to one or more contacts of another one of said structures. The structure M(N) is an end structure in the stack, and the structure M(N) comprises a first side not attached to any other one of said structures. The first side of the structure M(N) is processed with a blanket process comprising blanket removal of material from the first side. The blanket process exposes one or more first contacts protruding from the first side by at least a predetermined amount.

According to another aspect of the invention, a fabrication method comprises providing a structure S1 comprising a semiconductor substrate with circuitry adjacent to a first side of the structure. Material is removed from a second side of the structure S1 to expose one or more first contact structures, wherein the material is removed at least until the one or more first contact structures protrude from the second side by at least a predetermined amount, and wherein the material removal is a blanket removal process. Flowable material is deposited on the second side, wherein the flowable material is dielectric when hardened. The flowable material is subjected to a blanket material-removal process at least until the one or more first contact structures protrude on the second side by at least a predetermined amount, so that after the removal process the hardened flowable material covers the substrate on the second side.

In some embodiments, each first contact structure comprises a conductive contact and a dielectric covering the conductive contact on the second side. The removal process is followed by removing the dielectric to expose the conductive contact in each first contact structure. After the dielectric removal the hardened flowable material still covers the substrate on the second side.

According to another aspect of the invention, one or more vias are made in a first side of a first semiconductor wafer along one or more scribe lines. The first side of the first wafer is bonded to a second wafer. Material is removed from a second side of the first wafer until the vias become through holes. In some embodiments, the one or more vias form a groove completely surrounding at least one die in the first wafer.

According to another aspect of the invention, a structure comprises a first semiconductor wafer bonded to a second semiconductor wafer. The first wafer has one or more through holes on a boundary of at least one die of the first wafer.

According to another aspect of the invention, a first chip or wafer comprises a substrate made of a semiconductor or insulating material. The substrate comprises one or more through holes therein and a first contact in each of the through holes. Each contact comprises at least one conductive layer protruding from the first chip or wafer through at least one hole and also extending inside the substrate laterally away from the hole. The contacts are directly attached to a wiring substrate. The wiring substrate is a non-semiconductor substrate, or the wiring substrate is a semiconductor substrate without any active devices. The wiring substrate has one or more conductive lines for providing electrical connection to the first chip.

Some other features and advantages of the invention are described below. The invention is defined by the appended claims.

DESCRIPTION OF PREFERRED EMBODIMENTS

Figure 1:
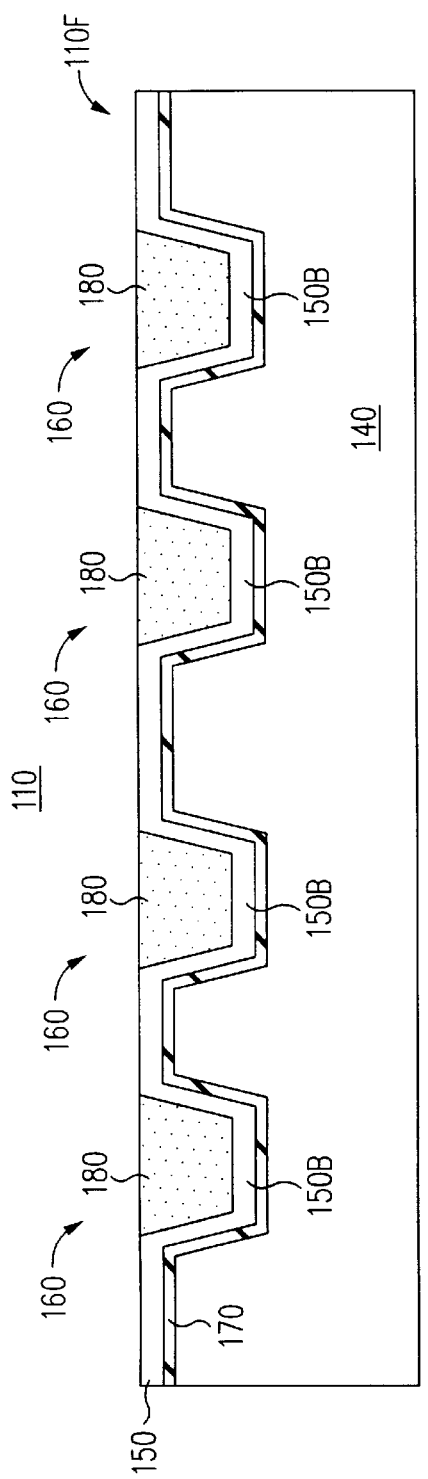
FIGS. 1, 2 and 3 are cross section illustrations of a packaging wafer (packaging substrate) at different stages of fabrication according to the present invention.
Figure 11:
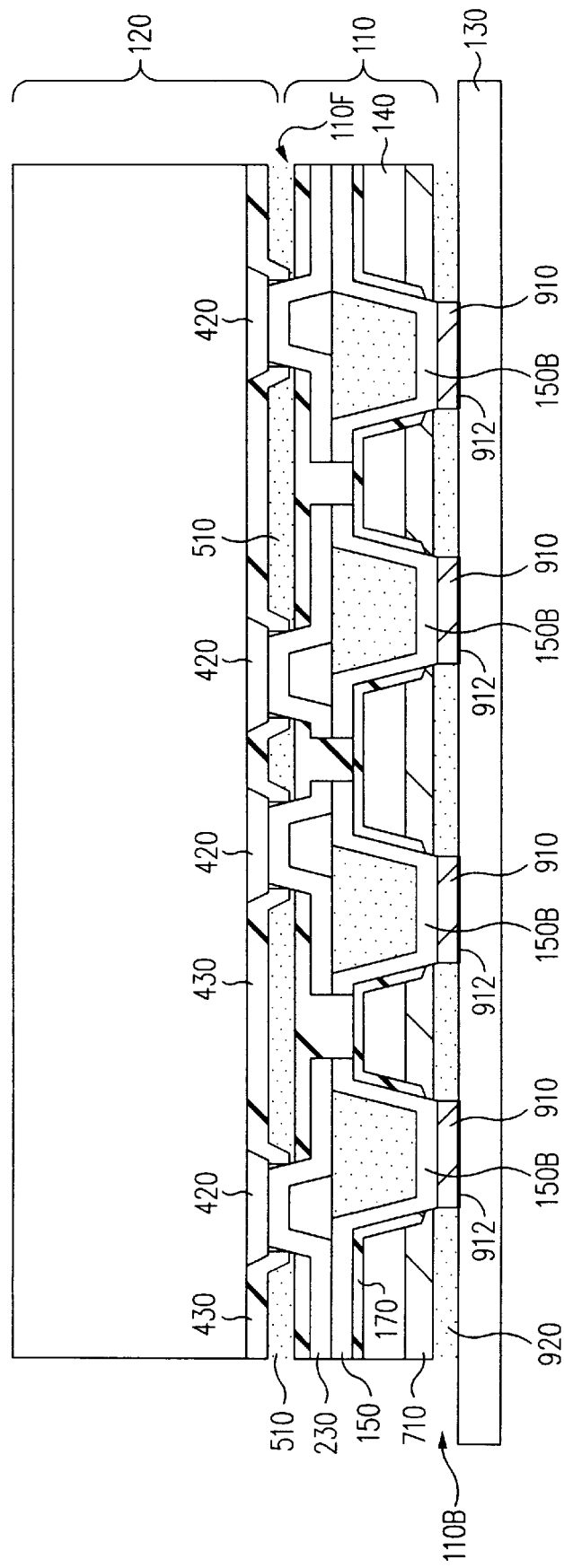

FIG. 1 shows a cross section of a wafer 110 at a beginning stage of fabrication. Wafer 110 will provide a first level packaging substrate for another wafer 120 (FIG. 11). The "face" side 110F of wafer 110 will be bonded to wafer 120, and the "back" side 110B to a second level wiring substrate, for example, a printed circuit board 130 (FIG. 11). In the embodiment being described, wafer 110 is made of silicon. However, other semiconductor and non-semiconductor materials can be used instead.

The beginning thickness of wafer 110 (of silicon substrate 140) is 600–750 $\mu$m, or some other value, chosen to achieve suitable mechanical strength and heat dissipation during manufacturing The final thickness will be smaller.

Back side contacts (conductive bumps) 150B on the wafer back side 110B are formed from metal 150. Before the metal is deposited vias 160 are etched in face side 110F of silicon substrate 140 at the locations at which the back side contacts will be formed. Suitable etching processes include those used to form back side contacts for vertical integration as described in PCT publication WO 98/19337 "Integrated Circuits and Methods for Their Fabrication" (TruSi Technologies, LLC, May 7, 1999) incorporated herein by reference. In one embodiment, the silicon is etched in atmospheric pressure plasma. The etcher is of type Tru-Etch 3000 (Trademark) available from Tru-Si Technologies, Inc., of Sunnyvale, Calif.

The horizontal and vertical dimensions of each via 160 are chosen based on the final thickness of wafer 110 and the dimensions of the corresponding back side contact 150B, as described below. The via sidewalls can be vertical if the etch is perfectly anisotropic, or they can be sloped, and they can be either straight or rounded. Bowl-like vias with rounded corners (see FIG. 7) can be created by an atmospheric pressure plasma etch.

A dielectric layer 170 is deposited over the wafer's face side, as described in the aforementioned publication WO 98/19337. In some embodiments, dielectric 170 is BPSG deposited by chemical vapor deposition at atmospheric pressure. Other processes (e.g., thermal oxidation of silicon or plasma enhanced chemical vapor deposition) and other insulating materials (e.g., undoped silicon dioxide, silicon nitride, or oxynitride) can also be used. See e.g., S. Wolfe et al., "Silicon Processing for the VLSI Era", Volume 1 (1986).

Then metal 150 is deposited as described in WO 98/19337. In some embodiments, metal 150 is aluminum, gold, nickel vanadium (NiV), titanium tungsten (TiW), or some other metal suitable for bonding to a second level packaging substrate. Metal 150 can be deposited by sputtering or other known techniques. Layer 150 can be a combination of different conductive layers, including possibly non-metal layers.

Then the vias 160 are filled with filling material 180, for example, spin-on glass, a polymer, metal, or some other conductive or non-conductive material (see WO 98/19937). In one embodiment, filler 180 is polyimide. The polyimide is spun on or sprayed on the wafer to provide a planar top surface, then cured, and then etched back until metal 150 is exposed outside the vias.

The filler 180 increases the wafer mechanical strength and provides a planar top surface.

In some embodiments, filler 180 is substantially restricted to the vias. The filler does not cover the metal 150 outside the vias. In other embodiments, filler 180 is conductive, and the filler material is left outside the vias, increasing the thickness of metal 150.

Then contact bumps 210 (FIG. 2) are formed on wafer face side 110F as follows. A polymer layer 220 is deposited and patterned to provide a bump at the location of each contact 210. In some embodiments, layer 220 is polyimide deposited to a thickness of 5 to 50 $\mu$m by a spin-on or spraying technique. Other materials, both conductive and non-conductive, and other thicknesses, are used in other embodiments.

A conductive layer 230 is deposited over the face side of the wafer. In some embodiments, layer 230 is aluminum, NiV, or TiW-Cu deposited to a thickness of 1 to 25 $\mu$m by sputtering or physical vapor deposition (PVD). Other materials, thicknesses, and deposition processes can also be used, consistent with other fabrication steps. For example, some aluminum deposition processes require heating to about 300° C. to provide good adhesion of aluminum to underlying materials. Such aluminum deposition process can be used if layer 220 is polyimide or some other material capable of withstanding the 300° C. temperature.

Figure 3:
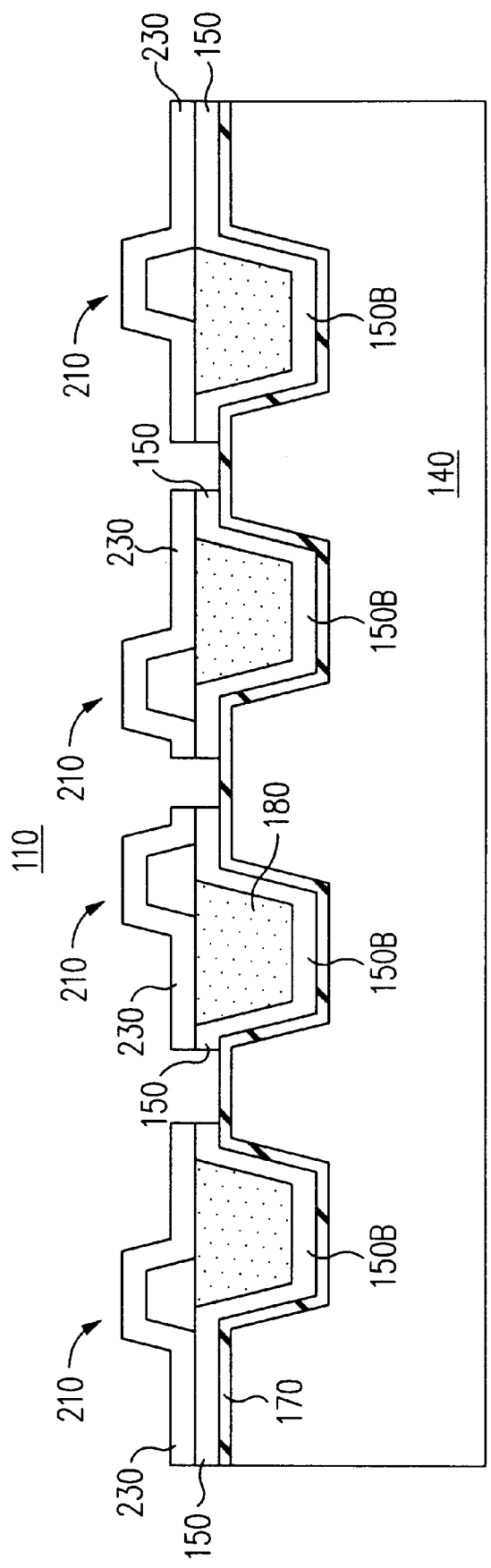

Then layers 150 and 230 are patterned (FIG. 3) to provide interconnects between face side contacts 210 and back side contacts 150B. In some embodiments, the same mask (not shown) is used to pattern both layers. If both layers are made of the same material (e.g., aluminum), the same etch can be used for both.

A dielectric passivation layer 410 (FIG. 4) is formed on face side 110F of wafer 110. For example, spin-on-glass, polymer (e.g., polyimide), epoxy, or some other suitable low viscosity material is spun on or sprayed on the wafer so that the material is less thick over the bumps 210 than elsewhere. Then the material is dried or cured at a temperature of 120° C. to 200° C. The temperature depends on the material. After the material has been deposited, an etch-back is performed until the bumps 210 protrude from the top surface of passivation 410 by some amount suitable for bonding the wafer 110 to wafer 120 (5 to 50 $\mu$m in some embodiments). The etch can be performed in vacuum plasma or atmospheric-pressure plasma. The etch chemistry depends on the material of layer 410, as known in the art. For example, if layer 410 is polymer, then oxygen plasma is appropriate. If layer 410 is spin-on glass, fluorine containing plasma can be used.

Before the wafers 110 and 120 are aligned and bonded, circuitry (not shown) is manufactured in wafer 120, including possibly transistors or other active devices in or adjacent to the wafer's face side 120F. Contact pads 420 are made on the wafer face side 120F from a material suitable for bonding with metal 230 by whatever bonding process is used. Before or after bonding, wafer 120 can be thinned from the back side if needed.

During bonding (FIG. 5), each contact 210 is bonded to a corresponding contact pad 420 of wafer 120. The bonding can be done by a diffusion process. In this process, the wafers 110 and 120 are pressed together and heated to achieve interdiffusion of materials 230, 420. In some embodiments, layers 230, 420 are aluminum, or include aluminum as the upper (external) layer, and the diffusion bonding is achieved by pressing the two wafers together and heating the structure as described in U.S. Pat. 4,890,784 entitled "Method for Diffusion Bonding Aluminum" (1990).

Alternatively, the wafers can be bonded with conductive or anisotropic adhesive. Solder can also be used (solder bumps can be grown on contact pads 420). See U.S. Pat. No. 5,831,832 (Nov. 3, 1998, Gillette et al.), U.S. Pat. No. 5,786,271 (Jul. 28, 1998, Ohida et al.), and U.S. Pat. No. 5,918,113 (Jun. 29, 1999, Higashi et al.) describing some bonding methods and materials. Other materials and bonding methods are used in other embodiments.

Figure 4:
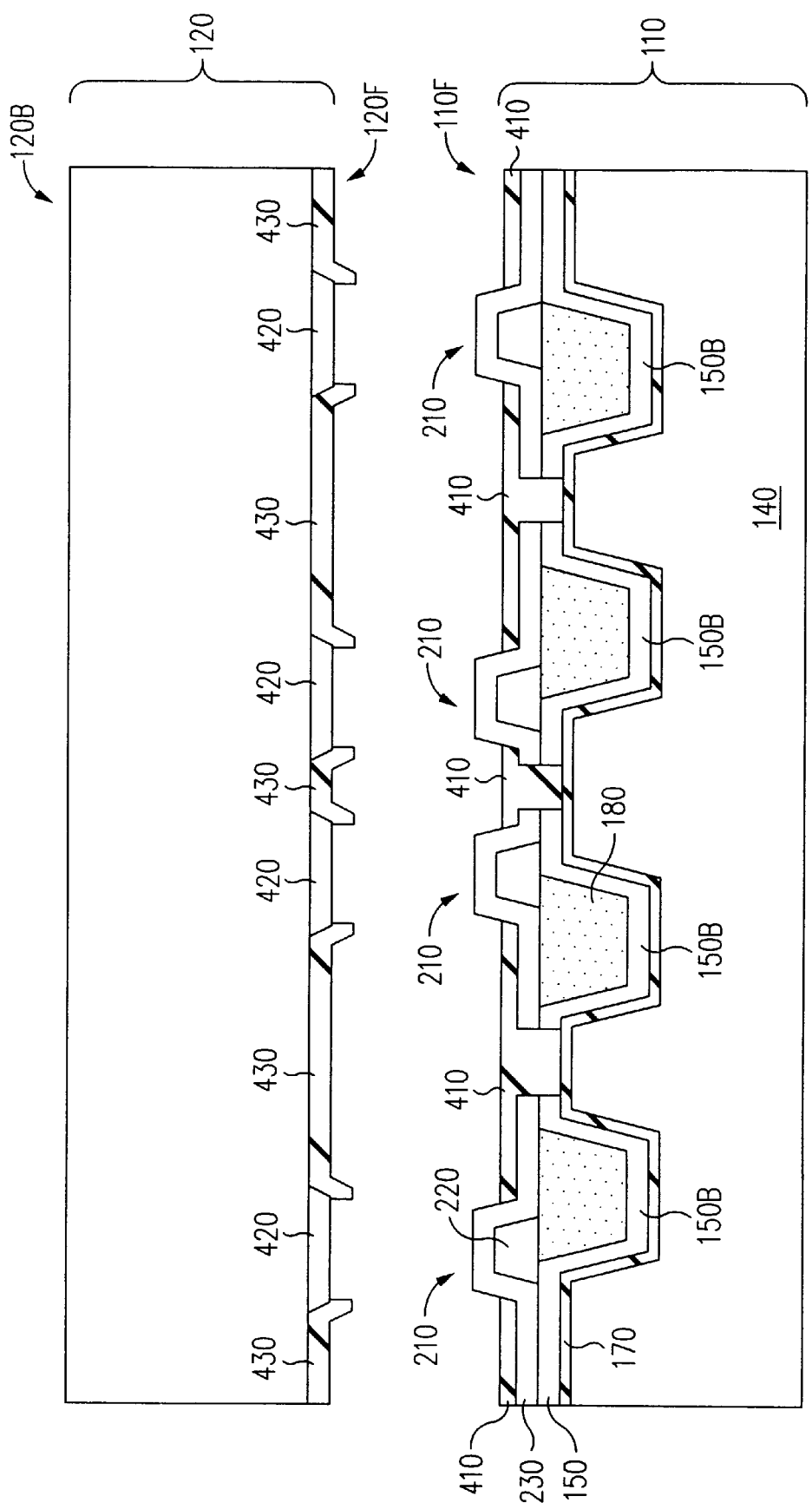
FIGS. 4 and 5 are cross section illustrations of a two-wafer structure at different stages of fabrication according to the present invention.
Figure 5:
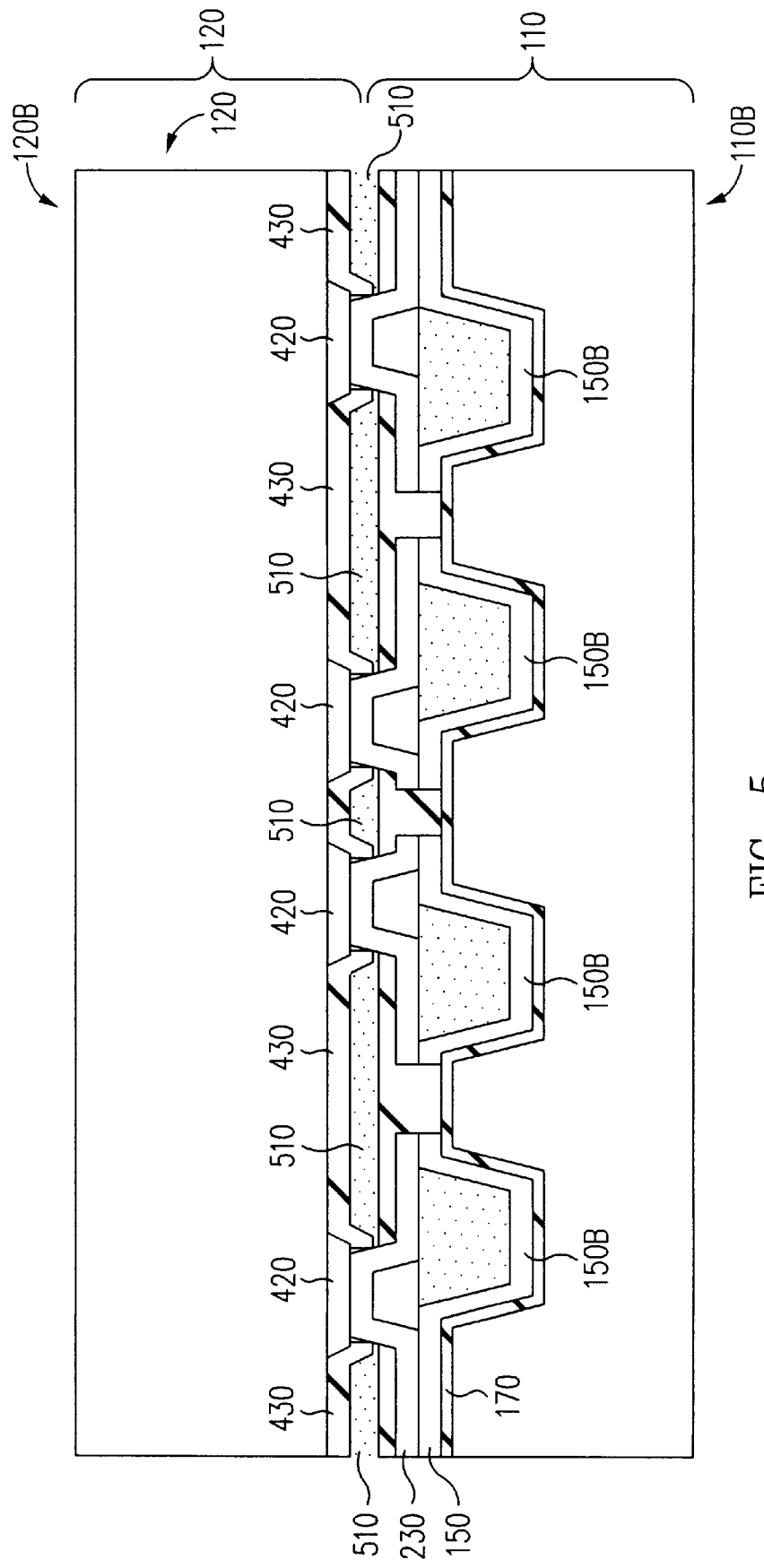

For some bonding processes including diffusion bonding and bonding with conductive adhesive, contact pads 420 need not protrude from the face side 120F of wafer 120. In FIGS. 4 and 5, contacts 420 do not protrude and, on the contrary, are recessed relative to the wafer surface. Passivation 430 (for example, silicon dioxide or silicon nitride) has been deposited and patterned to expose the contacts. The thickness of passivation layer 430 is 0.5 to 2 μm in some embodiments. No bumps are formed on pads 420.

Figure 2:
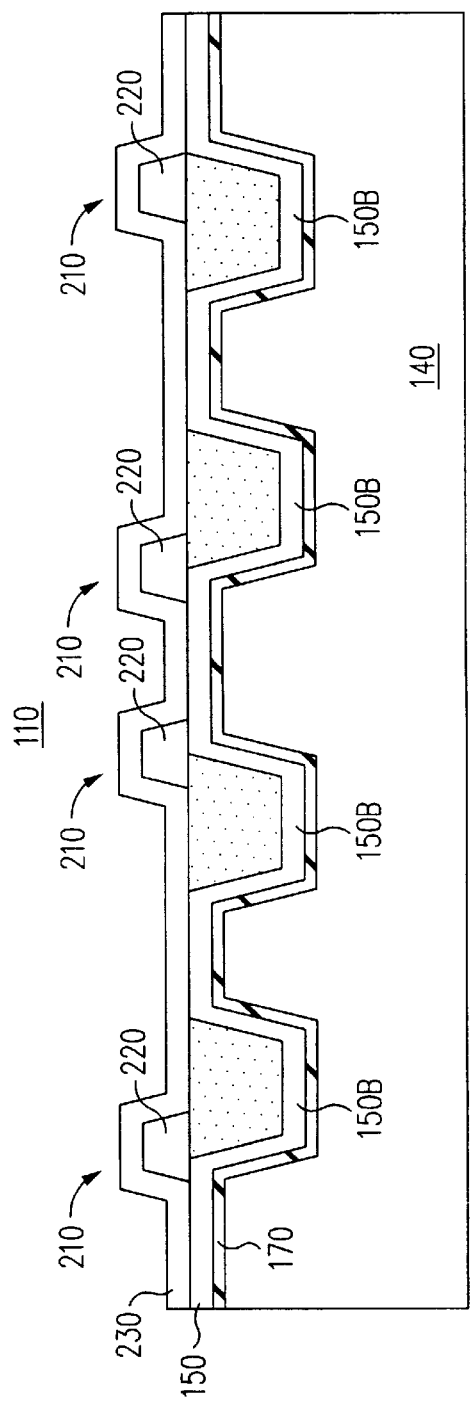
Figure 6:
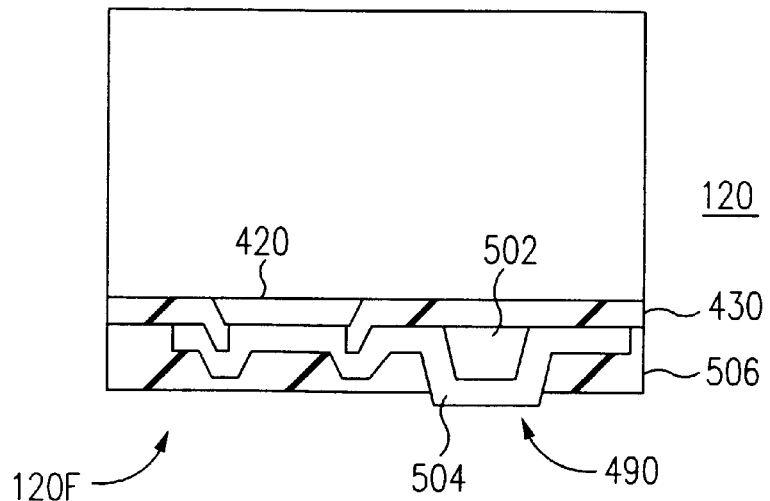
FIGS. 6 and 7 are cross section illustrations of wafers during fabrication according to the present invention.

In other embodiments, contact bumps 490 (FIG. 6) similar to bumps 210 are formed on face side 120F of wafer 120 before the wafers are bonded. Bumps 490 consist of bumps 502 covered by conductor 504. Bumps 502 are made of a polymer or another suitable material deposited over the passivation layer 430 and suitably patterned in a process which can be similar to formation of bumps 220 (FIG. 2). Conductor (e.g., metal) 504 is deposited and patterned over the bumps 502 to form conductive lines connecting the bumps to respective contacts 420. The materials and deposition processes for conductor 504 can be similar to those for conductor 230 (FIG. 2). Dielectric passivation layer 506 similar to layer 410 can be formed on face side 120F of wafer 120 to protect the contact pads 420 from unintentional electrical contact Then the bumps 490 are bonded to contacts 210.

In some embodiments, bumps 490 are bonded directly to a PCB. Wafer 110 is omitted.

Figure 7:
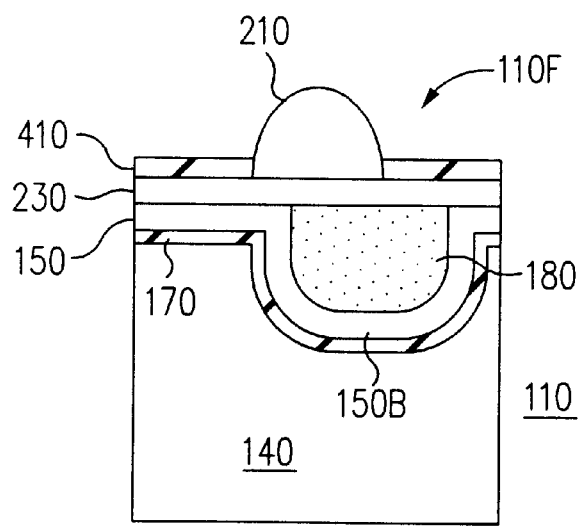

In FIG. 7, layer 220 on wafer 110 is omitted. Bumps 210 on wafer 110 are made of solder, nickel vanadium, gold, or some other material suitable for bonding, using known techniques (e.g., solder evaporation or electroplating).

In another variation, bumps 210 on wafer 110 are omitted. Bumps are formed on wafer 120 (e.g., by the process of FIG. 6 or using conventional solder, nickel vanadium, or gold technology), but not on wafer 110.

Wafer 120 can be made of silicon or non-silicon material, not necessarily the same material as wafer 10. However, if the same materials are used for the two wafers, their thermal expansion coefficients will advantageously be the same.

Dielectric adhesive 510 (FIG. 5) can be introduced in liquid form between the wafers and then cured to increase the mechanical strength of the structure. Suitable materials include adhesives used in vertical integration processes and as underfill materials in flip chip packaging. See the aforementioned PCT publication WO 98/19337 (TruSi Technologies) and U.S. Pat. No. 5,786,271 (Ohida et al.).

Figure 8:
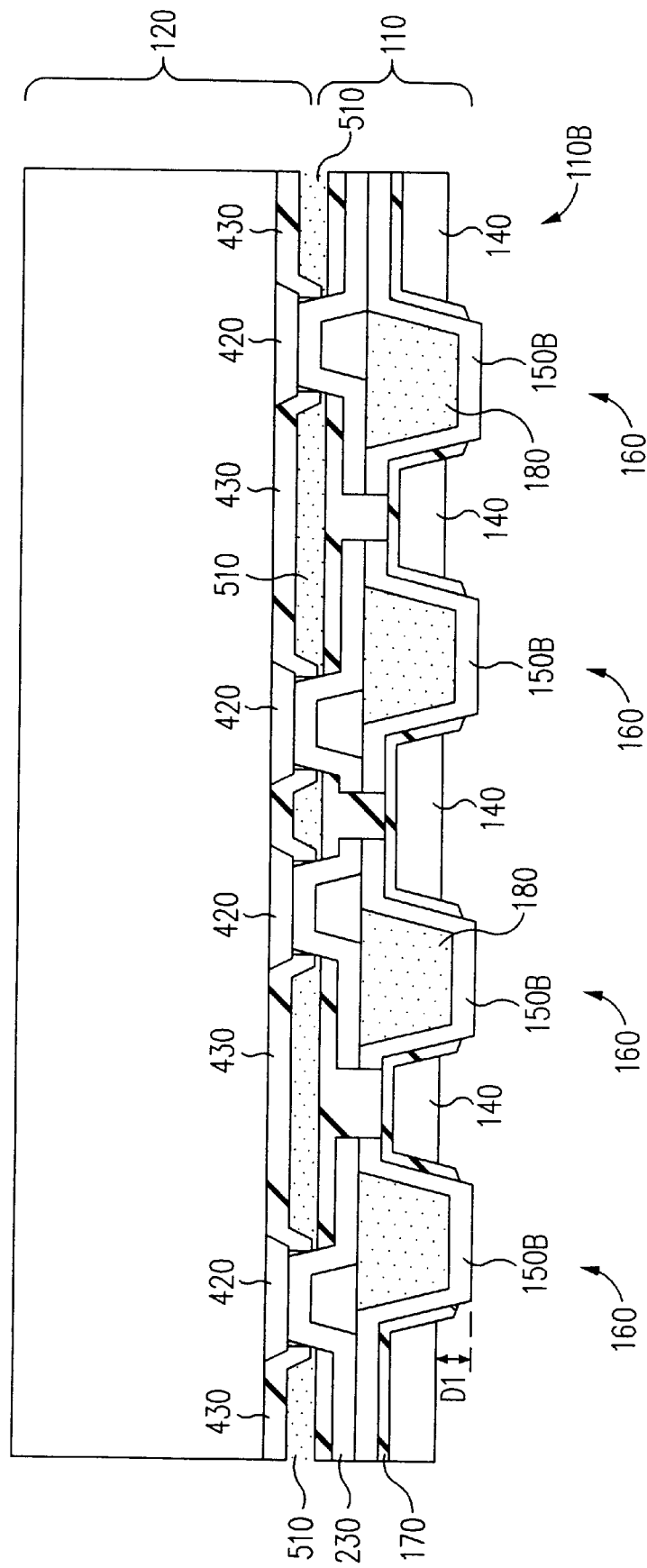
FIGS. 8–11 are cross section illustrations of a two-wafer structure at different stages of fabrication according to the present invention.

Then silicon is removed from back side 110B of wafer 110. FIG. 8 shows the resulting structure for the face side contacts embodiment of FIGS. 4 and 5. At the end of the removal process, the vias 160 are exposed (they become through holes) and the metal 150 protrudes out of the wafer back side 110B by at least a predetermined amount D1. In some embodiments, D1 is 10 μm or greater. The silicon is removed by a blanket (non-masked) process, which can be a dry etch, erg., an atmospheric pressure plasma etch of the kind described in the aforementioned publication WO 98/19337. The etch can be preceded by mechanical grinding. Other processes can also be used. Advantageously, the circuitry on the face sides 110F, 120F of the two wafers is protected by the wafers and the adhesive 510. Further, because the wafers have been bonded together, the structure is mechanically stronger, and heat dissipation is improved. Also, warpage of wafer 110 is lessened or eliminated (very thin wafers can be warped by stresses caused by the presence of metal or other materials in the wafers).

In some embodiments, the resulting thickness of wafer 110 measured from the top surface of contacts 210 (of metal 230) to the bottom surface of contacts 150B is 30–50 μm. Other thicknesses are also possible.

In FIG. 8, when the dielectric 170 becomes exposed on the back side during the etch, the dielectric is etched slower than the rest of the wafer. In some silicon embodiments, the dielectric is silicon dioxide, and the dielectric is etched 8 to 10 times slower, as described in WO 98/19337. As a result, after the etch, the dielectric protrudes down from the back side surface of silicon 140 around the contacts 150B. The protruding dielectric improves electrical insulation of silicon 140 during subsequent attachment of the wafer to wiring substrate 130 (FIG. 11).

In other embodiments, dielectric 170 is etched at the same speed as silicon 140, so no protrusions are formed.

The structure is turned upside down (FIG. 9), and a passivation layer 710 is deposited. In some embodiments, layer 710 is polyimide, glass, or some other flowable material (e.g., flowable thermosetting polymer) which can be deposited by a spin-on or spraying process and which is dielectric when cured. Low viscosity materials are particularly suitable but low viscosity is not necessary. In some embodiments, the top surface of layer 710 is substantially planar. In one embodiment, the thickness of layer 710 over the metal contacts 150B is 0.5 to 5 μm. Other thicknesses can also be used. In other embodiments, the top surface of layer 710 is not planar, and layer 710 does not necessarily cover the contacts 150B. At any rate, if layer 710 covers the contacts, the layer 710 is thinner over the contacts 150B than between the contacts.

Layer 710 is etched by a blanket etch (FIG. 10) until the contacts 150B protrude by a distance D2, which is 2 to 20 μm in some embodiments. If layer 710 is polyimide, the etch can be performed in atmospheric pressure oxygen plasma in an etcher of type Tru-Etch 3000.

In some embodiments, before layer 710 is deposited, silicon dioxide (not shown) is selectively grown on the back side 110B of silicon substrate 140, but not on metal 150B, by a plasma process described in WO 98/19337, using a Tru-Etch 3000 etcher (even though this is not an etching process). Layer 710 can be omitted.

Then the two-wafer sandwich is diced if needed, to provide separate two-die structures. (In some embodiments, the wafers are not diced.)

Then the two-wafer structure, or each two-die structure, is attached to a wiring substrate such as PCB 130 (FIG. 11). In one embodiment, contacts 150B are attached to the PCB using solder paste 910 deposited on PCB contacts 912 by a known process. Diffusion bonding, conductive or anisotropic adhesive, or other techniques, known or to be invented, can also be used. Underfill 920 is introduced between the PCB and the wafer or die sandwich to increase mechanical strength. Plastic encapsulant (not shown) is deposited over the dies or wafers using known techniques.

The final dimensions of protruding contacts 150B (FIGS. 10, 11) can be chosen to accommodate the technology used for attaching the wafer or die sandwich to the PCB. The dimensions can be controlled by controlling the size of vias 160, the back side etch parameters for the etch of wafer 110, and the thickness of layer 710 or any other insulator grown on the wafer back side In some embodiments, the bottom surface of each contact 150B is a square having a side of 20 μm or greater. Alternatively, the contacts 150B may have a rounded shape and look like a circle in the bottom view, of a radius 20 μm or greater The height of each contact, measured to the bottom surface of layer 710 (in the view of FIG. 11) is 10 to 20 μm. Other dimensions are also possible.

Figure 13B:
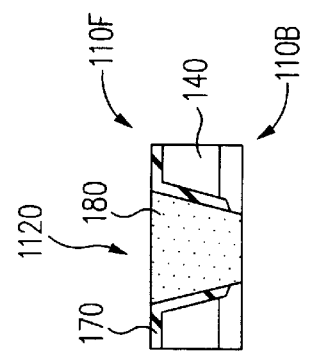
FIG. 13B is a cross section illustration of the wafer of FIG. 13A.
Figure 13A:
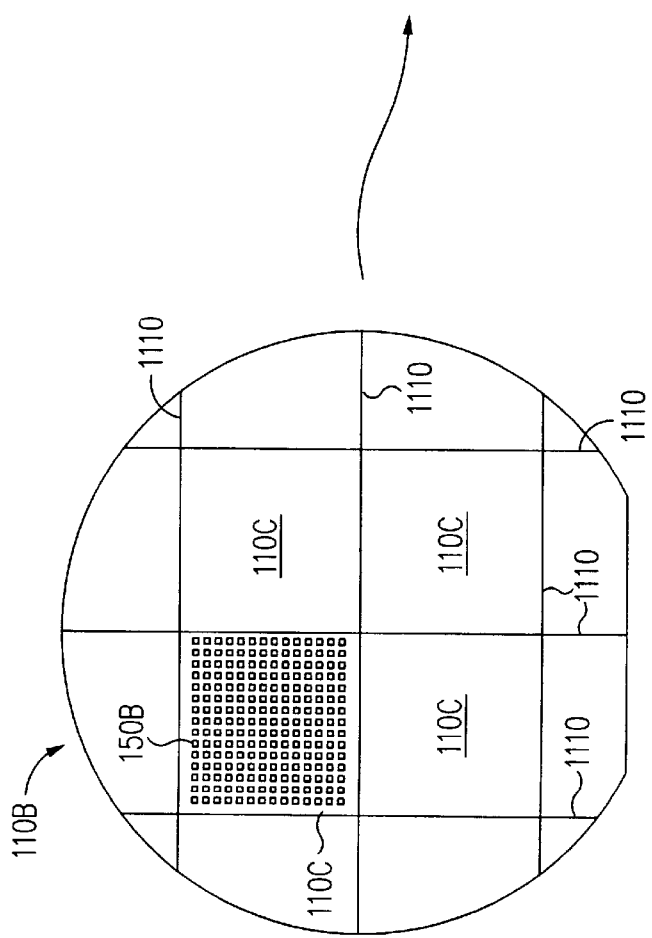
FIG. 13A is a plan view of a wafer according to the present invention.

Contacts 150B can be evenly distributed on the back side surface 110F of wafer 110 to provide an area matched package (as shown in FIG. 13A). In some embodiments, the distance between the centers of the adjacent contacts is 75 to 1000 μm. Other distances can be used as needed to accommodate tolerances of the process of attaching the wafers to the PCB.

It is clear from the foregoing that the wafer 110 can be manufactured using processes common in semiconductor fabrication, without using uncommon processes such as electroplating or solder evaporation.

Elimination of solder bumping on wafers 110 and 120 is advantageous because solder bumping tolerances do not have to be accommodated. Contacts 210 on the wafer face side 110F can be made with smaller lateral dimensions, and can be positioned closer together to match high precision semiconductor fabrication technology that can be used to manufacture the wafer 120. Other disadvantages of solder bumping are also eliminated, such as different bumps having different heights or bumps being lost due to solder collapse.

The invention is not limited to such embodiments. Some embodiments use solder bumping.

In some embodiments, wafer 110 is made of a dielectric material, for example, a polymer. Suitable polymers include polyimide. Dielectric layers 170, 710 can be omitted.

Wafer 110 can contain multiple layers of wiring as needed to connect the contacts 210 to back side contacts 150B.

FIG. 11 illustrates certain structural features of the chip or wafer 110. The chip or wafer includes a semiconductor or insulating substrate 140. The substrate has one or more through holes in it. A contact 150B is provided in each of the holes. Each contact 150B includes at least one conductive layer 150 protruding down from the chip or wafer 110 through at least one hole. The conductive layer 150 also goes inside the substrate 140 and extends laterally away form the hole.

Figure 12:
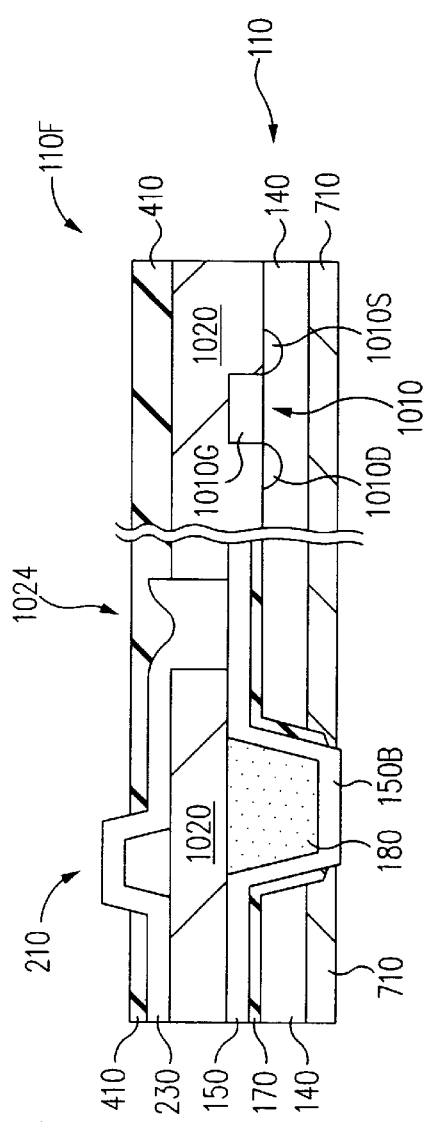
FIG. 12 is a cross section illustration of a wafer during fabrication according to the present invention.

In FIG. 12, wafer 110 contains additional circuitry schematically represented by MOS transistor 1010 formed in silicon 140 on the wafer face side 110F. (Transistor 1010 includes source and drain regions 1010S, 1010D, and gate 1010G.) The contact fabrication steps described above in connection with FIGS. 1–4 (before the wafer 110 is bonded to wafer 120) are combined with steps forming the transistor 1010 or other circuitry as suitable for a particular fabrication process. For example, metal 150 may be deposited after formation of the gate oxide (not shown) of transistor 1010 if metal 150 is aluminum or some other low melting point metal and if the gate oxide is formed by high temperature thermal oxidation. The invention is not limited to MOS circuitry or aluminum, however.

In FIG. 12, layer 1020 represents one or more layers formed during the wafer 110 fabrication. Bumps 210 are formed above layer 1020. Metal 230 contacts metal 150 through a via 1024 in layer 1020. Alternatively, the contact can be made through intermediate layers (not shown) using multiple vias. After the bumps 210 are formed, fabrication proceeds as described above in connection with FIGS. 4–11.

In some embodiments, the circuitry in wafer 110 (or individual dies obtained from the wafer) includes ESD (electrostatic discharge) or overvoltage protection circuits, or some other circuits encountered in different types of devices. Hence, the same wafer 110 design can be combined with different kinds of wafers 120. Other examples of such circuits in wafer 110 include voltage regulators and DC converters. In one example, wafer 110 includes a voltage converter that converts a 3.3V power supply voltage available on the PCB to a 1.2V supply voltage. In another example, wafer 110 includes a converter that receives a 5V power supply voltage from the PCB and generates both 3.3V and 1.2V supply voltages for wafer 120. Voltage converters and regulators sometimes occupy large area and consume much power (generate much heat). Removing such circuits from wafer 120 to wafer or die 110 is therefore advantageous.

In some embodiments, wafer 120 is omitted. All the circuitry is in wafer 110. No contacts are formed on the face side of wafer 110. Thus, the layers 220, 230 are omitted. The wafer 110, or individual chips obtained from the wafer, are directly attached to a PCB or another wiring substrate as first level packaging. The attachment is made using back side contacts 150B.

Back side contacts 150B can be used as alignment marks when wafer 110 or the wafer sandwich 110, 120 is diced. Additional alignment marks can be created along the scribe lines as shown in FIGS. 13A and 13B. FIG. 13A shows the wafer 110 back side before dicing. In this example, the wafer includes four chips 110C. Back side contacts 150B are shown on only one of the chips for simplicity. Lines 1110 are scribe lines along which the wafer sandwich will be diced. On one or more lines 1110, vias 1120 (FIG. 13B) are etched in the face side 110F at the same time as vias 160 to form additional alignment marks. Vias 1120 can be made narrow to occupy less wafer area. In some embodiments, vias 1120 form grooves extending along entire scribe lines 1110. In other embodiments, vias 1120 do not extend all the length of the scribe lines, allowing portions of scribe lines 1110 to be used for test circuitry When metal layers 150, 230 (FIG. 2), and possibly other layers, are patterned, they can be etched off one or more vias 1120 to reduce stress on silicon substrate 140 during dicing, as shown in FIG. 13B. In any case, the stress is reduced due to the presence of an interface between the filler 180 in vias 1120 and the silicon substrate 140. Also, the filler is visible on the wafer back side, thus providing alignment marks In some embodiments, the filler in vias 1120 is different from the filler in vias 160. The filler in vias 1120 can be soft material to reduce the stress on the silicon substrate 140 when the wafer is diced. Further, before dicing, the filler in vias 1120 can be etched away.

In some embodiments, instead of sawing the wafers, dicing is accomplished by simply breaking the wafers along the scribe lines 1110. Wafer 120 has vias (not shown) similar to vias 1120, along the scribe lines. The vias in wafer 120 are filled with soft material. Before dicing, back side 120B (FIG. 5) of wafer 120 is etched to expose the vias. This etch can be done after the wafers 110 and 120 are bonded together, so that the wafer 120 face side is protected.

In some embodiments, the wafer sandwich is sawed part of the way, and then broken.

Figure 16:
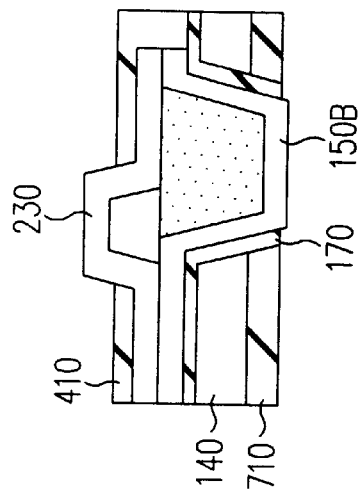
FIGS. 14–16 are cross section illustrations of a wafer during fabrication according to the present invention.
Figure 14:
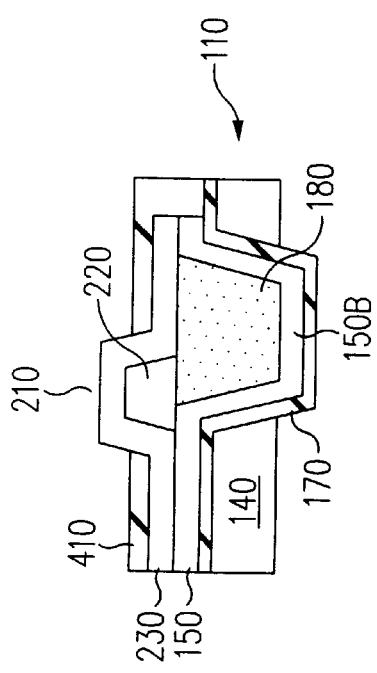
Figure 15:
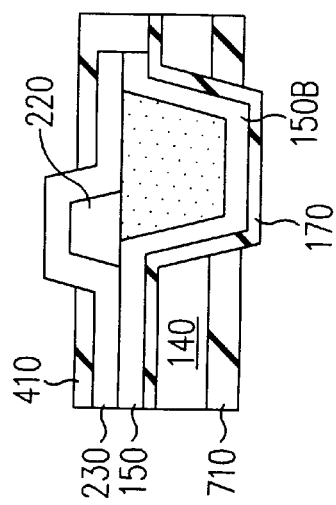

FIGS. 14–16 show a variation of the wafer 110 back side processing. FIG. 14 shows the stage of FIG. 8, i.e., after the back side silicon etch of wafer 110. Wafer 120 is not shown for simplicity, and only one back side contact 150B is shown. In this variation, the silicon etch does not remove the insulator 170 from metal 150. Suitable silicon etches include an atmospheric pressure fluorine-containing plasma etch in a Tru-Etch 3000 etcher.

Figure 9:
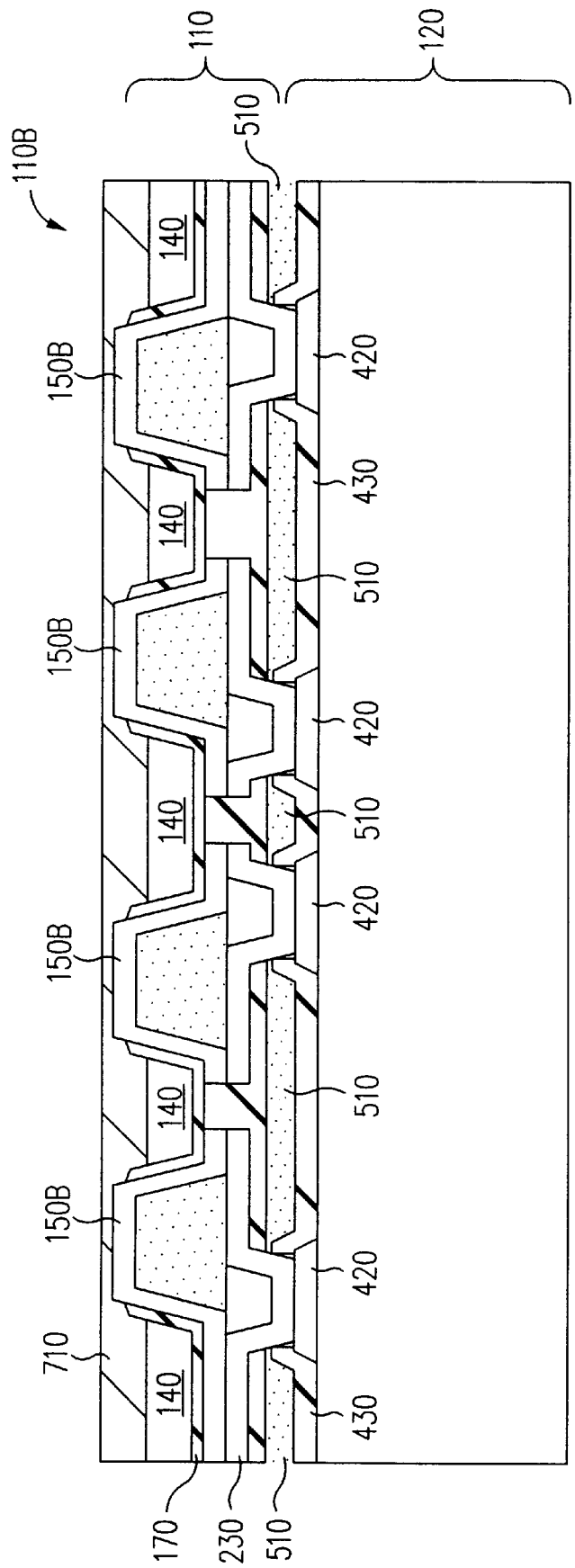
Figure 10:
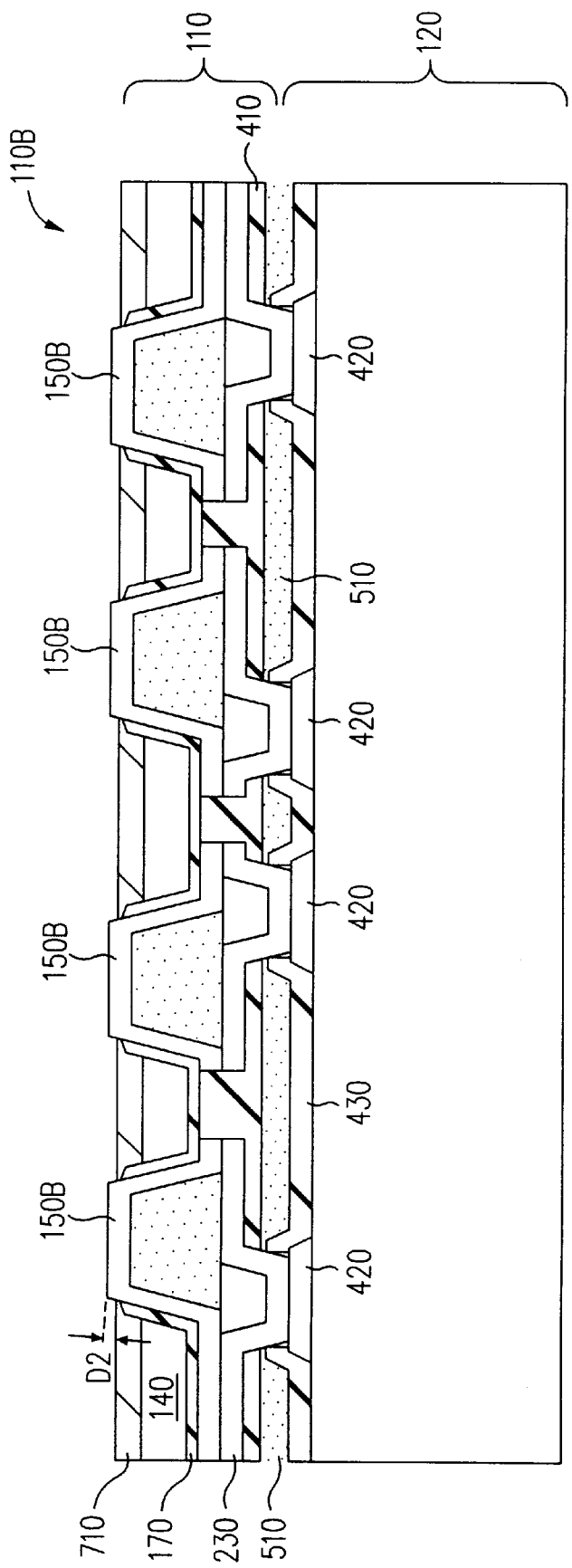

Then back side passivation layer 710 (FIG. 15) is deposited and etched as in FIGS. 9 and 10. Dielectric 170 still covers the metal 150 after the etch. In one example, passivation 710 is polyimide, and dielectric 170 is silicon dioxide. Polyimide 710 is etched by oxygen plasma in an etcher Tru-Etch 3000 or some other suitable etcher. During this etch, silicon dioxide 170 protects metal 150 from oxidation. The process is particularly suitable if metal 150 is easily oxidizable (e.g., aluminum). Therefore, one does not have to use gold or other expensive metals that are not easily oxidizable.

Then the dielectric 170 is etched off the metal 150 to expose the back side contacts 150B (FIG. 16). In some embodiments, dielectric 170 is silicon dioxide, metal 150 is aluminum, and the etch is performed in a fluorine-containing plasma. Fluorine does not react with aluminum or with polyimide 710.

Figure 17:
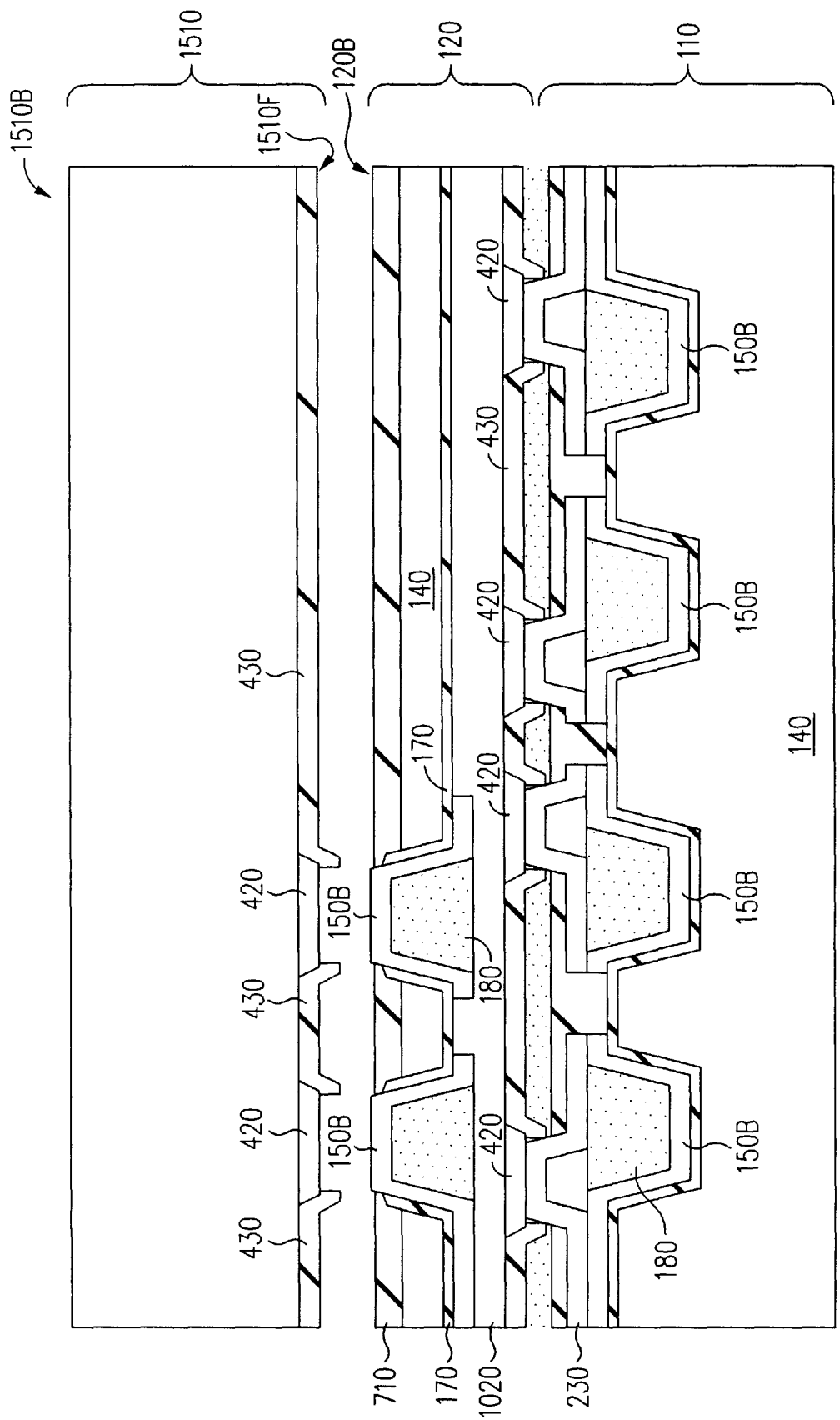
FIG. 17 is a cross section illustration of a three-wafer structure during fabrication according to the present invention.

In FIG. 17, back side 120B of wafer 120 is bonded to a third wafer 1510 before the wafer 110 back side contacts 150B are exposed. Wafer 120 contains back side contacts 150B similar to contacts 150B in wafer 110. Wafer 120 of FIG. 17 also contains a substrate 140, an insulator 170, passivation 710, and intermediate layer or layers 1020, such as described above for wafer 110 (FIG. 12). Other structures for wafer 120 are possible, such as used in vertical integrated circuits. See, for example, the aforementioned PCT publication WO 98/19337 (TruSi Technologies).

The contacts 150B of wafer 120 are exposed after the wafers 110 and 120 have been bonded. The contacts can be exposed using the processes described above for wafer 110 (see FIGS. 8–16 and accompanying text). Wafer 120 can be bonded to wafer 1510 using the bonding processes described above for bonding the wafer 120 to wafer 110 (FIGS. 4 and 5), or other processes used in vertical integration. In FIG. 17, face side contacts 420 and passivation 430 in wafer 1510 are similar to those in wafer 120. Other embodiments use dissimilar contact structures in the two wafers.

In some embodiments, wafer 1510 also has back side contacts (not shown). After the wafers 120 and 1510 have been bonded, these contacts are exposed, and additional wafers are bonded to the back side 1510B of wafer 1510.

Then the wafer 110 back side contacts are exposed, and the wafer stack is attached to the PCB (possibly after dicing), as described above in connection with FIGS. 8–16.

An alternative fabrication sequence is as follows:

1. After wafer 120 has been manufactured but before its contacts 420 have been opened, the wafer 120 back side contacts 150B are exposed, and the wafer is bonded to face side 1510F of wafer 1510. The bonding to wafer 110 has not yet been done.

2. Possibly additional wafers are bonded to the back side 1510B of wafer 1510.

3. Passivation 430 on the face side of wafer 120 is etched to expose the wafer's contacts 420.

4. Wafer 120 is bonded to wafer 110.

5. Possibly additional wafers are bonded to the wafer stack at the end opposite to wafer 110 (i.e., the end faced by the back side 1510B).

6. Wafer 110 back side contacts 150B are exposed and attached to PCB 130.

Figure 18:
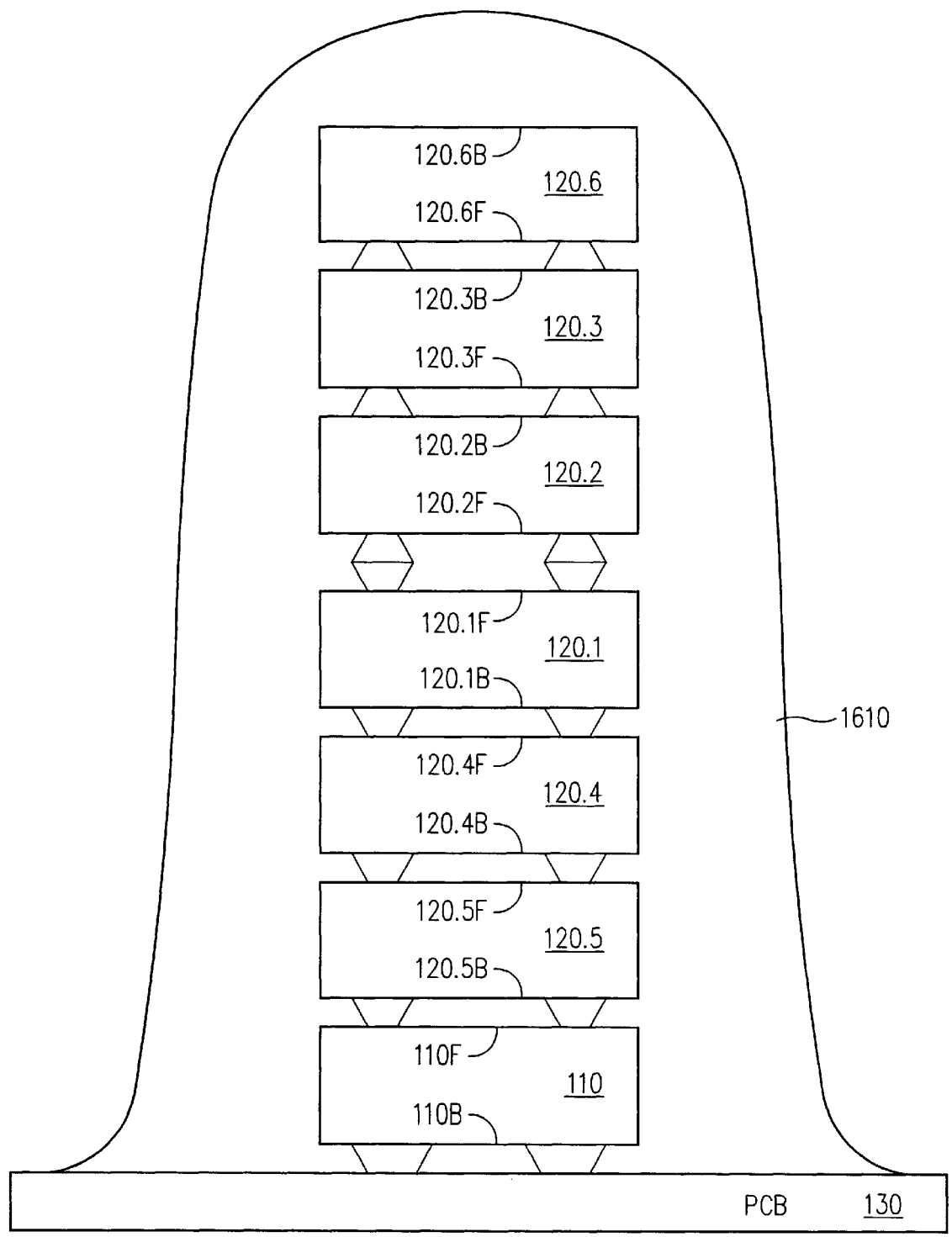
FIG. 18 is a cross section illustration of a vertical integrated circuit mounted on a PCB according to the present invention.

In FIG. 18, a stack of wafers 120.1 through 120.6 is attached to first level packaging wafer 110, which is attached to PCB 130. The suffix F in numerals such as 120.2F indicates the face side of the corresponding wafer, and the suffix B indicates the back side. The face side may have active circuitry (e.g., transistors). Each of wafers 120.1 through 120.5 has back side contacts attached to another wafer.

The structure of FIG. 18 is manufactured as follows. First, the wafers 120.1 and 120.2 are bonded together, face side 120.1F to face side 120.2F, before any back side contacts on any wafers are exposed. Then one of the wafers 120.1, 120.2 has its back side contacts exposed and bonded to the face side of another wafer. For example, back side 120.1B of wafer 120.1 is bonded to face side 120.4F of wafer 120.4. Then one of the two end wafers (120.2 or 120.4) has its back side contacts exposed and bonded to the face side of another wafer, and so on, until the whole stack of wafers 120.1–120.6 and 110 has been assembled. Then the wafer 110 back side contacts are exposed, dicing is performed if needed, and the wafer stack or each chip stack is bonded to the PCB.

Encapsulant 1610 (e.g., suitable resin) is deposited to encapsulate the wafer stack or each chip stack using known techniques.

In some embodiments, the wafers 110, 120.1–120.6 of FIG. 18 have similar face side contact structures, and the wafers 110, 120.1–120.5 have similar back side contact structures, except possibly that the back side contacts in wafer 110 are larger, and are spaced farther from each other, to accommodate the PCB fabrication and mounting tolerances. In some embodiments, the size and shape of the back side contacts on wafers 120.1–120.5 are as described above for FIG. 13A (20 $\mu$m radius or 20 $\mu$m square side). The distance between the centers of the adjacent contacts is 150 $\mu$m.

The invention is not limited to the embodiments described above. In particular, the invention is not limited to any materials, fabrication steps or sequences of steps, or any particular fabrication equipment. In some embodiments, the PCB 130 is replaced with a semiconductor wafer or some other substrate, known or to be invented. Other embodiments and variations are within the scope of the invention, as defined by the appended claims.

What is claimed is:

1. A fabrication method comprising:

forming one or more vias in a first side of a first substrate;

forming a conductive contact in each of the vias so that each contact is not exposed on a second side of the first substrate;

exposing each contact on the second side of the first substrate with a blanket process which includes removing material from the second side of the first substrate, wherein the blanket process causes each contact to protrude from the second side of the first substrate; and bonding at least one contact on the second side of the first substrate to a wiring substrate so that the first substrate or a portion thereof becomes directly attached to the wiring substrate, wherein the wiring substrate is a non-semiconductor substrate.

2. The method of claim 1 wherein the first substrate is a semiconductor wafer, the bonding is preceded by dicing the wafer into one or more dice, and the bonding results in at least one die being directly attached to the wiring substrate.

3. The method of claim 1 wherein the first substrate is a wafer, and the method further comprises, before said bonding, bonding the first side of the first substrate to a second substrate to manufacture a vertical integrated circuit.

4. A method for fabricating a vertical integrated circuit, the method comprising:

providing a vertically integrated stack of two or more structures M(1), . . . M(N), wherein each structure comprises one or more contacts directly attached to one or more contacts of another one of said structures, wherein the structure M(N) is an end structure in the stack, and the structure M(N) comprises a first side and a second side, the second side not being attached to any other one of said structures;

processing the first side of the end structure M(N) of the stack with a blanket process comprising blanket removal of material from the second side, wherein the blanket process exposes one or more first contacts protruding from the second side by at least a predetermined amount.

5. The method of claim 4 further comprising bonding each first contact to a structure M(N+1), wherein the blanket process exposes one or more features which are used as alignment marks during the bonding to the structure M(N+1).

6. The method of claim 4 wherein:

the structure M(N) comprises a wafer which comprises one or more dice;

the method comprises separating the stack into separate parts, at least one of the parts including a die from the structure M(N);

the structure M(N) has a first side attached to the structure M(N−1), and before the blanket process the structure M(N) has one or more vias made in the first side at the boundary of at least one of the dice, wherein each via is made part way through the structure M(N); and the blanket process results in the one or more vias becoming exposed on the second side of the structure M(N).

7. A fabrication method comprising:

providing a structure S1 comprising a semiconductor substrate with circuitry adjacent to a first side of the structure;

removing material from a second side of the structure S1 to expose one or more first contact structures, wherein the material is removed at least until the one or more first contact structures protrude from the second side by at least a predetermined amount, and wherein the material removal is a blanket removal process;

depositing flowable material on the second side, wherein the flowable material is dielectric when hardened;

subjecting the flowable material to a blanket material-removal process at least until the one or more first contact structures protrude on the second side by at least a predetermined amount, so that after the removal the hardened flowable material covers the substrate on the second side.

8. The method of claim 7 wherein each first contact structure comprises:

a conductive contact; and a dielectric covering the conductive contact on the second side; and wherein the removal process is followed by removing the dielectric to expose the conductive contact in each first contact structure, wherein after the dielectric removal the hardened flowable material still covers the substrate on the second side.

9. A semiconductor fabrication method comprising:

making one or more vias in a first side of a first semiconductor wafer along one or more scribe lines;

bonding the first side of the first wafer to a second semiconductor wafer; and removing material from a second side of the first wafer until the vias become through holes.

10. The method of claim 9 wherein the vias become through holes during a blanket dry etch of the first wafer.

11. The method of claim 9 wherein the one or more vias form a groove completely surrounding at least one die in the first wafer.

12. The method of claim 4 wherein each of the structures M(1), . . . M(N) comprises a semiconductor integrated circuit.

13. The method of claim 6 wherein each of the structures M(1), . . . M(N) comprises a semiconductor wafer.

14. The method of claim 12 wherein providing the stack of structures comprises manufacturing each of the structures M(1), . . . M(N) and attaching these structures together to form the stack of structures.

15. The method of claim 6 wherein separating the stack comprises dicing the stack.

16. A fabrication method comprising:

forming one or more vias in a first side of a first substrate;

forming a conductive contact in each of the vias so that each contact is not exposed on a second side of the first substrate;

exposing each contact on the second side of the first substrate with a blanket process which includes removing material from the second side of the first substrate, wherein the blanket process causes each contact to protrude from the second side of the first substrate; and bonding at least one contact on the second side of the first substrate to a printed circuit board (PCB) so that the first substrate or a portion thereof becomes directly attached to the PCB.

17. The method of claim 16 wherein the first substrate is a semiconductor wafer, the bonding is preceded by dicing the wafer into one or more dice, and the bonding results in at least one die being directly attached to the PCB.

18. The method of claim 16 wherein the first substrate is a wafer, and the method further comprises, before said bonding, bonding the first side of the first substrate to a second substrate to manufacture a vertical integrated circuit.

19. A fabrication method comprising:

forming one or more vias in a first side of a first substrate;

forming a conductive contact in each of the vias so that each contact is not exposed on a second side of the first substrate;

exposing each contact on the second side of the first substrate with a blanket process which includes removing material from the second side of the first substrate, wherein the blanket process causes each contact to protrude from the second side of the first substrate; and bonding at least one contact on the second side of the first substrate to a wiring substrate so that the first substrate or a portion thereof becomes directly attached to the wiring substrate, wherein the wiring substrate is a semiconductor substrate without any active devices.

20. The method of claim 19 wherein the first substrate is a semiconductor wafer, the bonding is preceded by dicing the wafer into one or more dice, and the bonding results in at least one die being directly attached to the wiring substrate.

21. The method of claim 19 wherein the first substrate is a wafer, and the method further comprises, before said bonding, bonding the first side of the first substrate to a second substrate to manufacture a vertical integrated circuit.

22. A fabrication method comprising:

forming one or more first vias in a first side of a first substrate;

forming a first conductive contact in each of the first vias so that each first contact is not exposed on a second side of the first substrate;

forming one or more second vias in a first side of a second substrate;

forming a second conductive contact in each of the second vias so that each second contact is not exposed on a second side of the second substrate;

attaching the first side of the first substrate to the first side of the second substrate;

after the attaching operation, removing material from the second side of the first substrate to expose the one or more first contacts, and bonding the one or more exposed first contacts to one or more conductive contacts on a third substrate; and then removing material from the second side of the second substrate to expose the one or more second contacts, and bonding the one or more exposed second contacts to one or more conductive contacts on a fourth substrate.

23. The method of claim 22 wherein each of the first and second substrates is a semiconductor substrate, and the method further comprises manufacturing a transistor region in at least one of the first and second substrates before the attaching operation.

24. The method of claim 22 wherein each of the first and second substrates is a semiconductor substrate, and the method further comprises manufacturing a transistor region in each of the first and second substrates before the attaching operation.

25. The method of claim 22 wherein the first, second and third substrates are semiconductor substrates, and the method further comprises manufacturing a transistor region in at least one of the first, second and third substrates before bonding a first contact to a contact on the third substrate.

26. The method of claim 22 wherein the first, second and third substrates are semiconductor substrates, and the method further comprises manufacturing a transistor region in each of the first, second and third substrates before bonding a first contact to a contact on the third substrate.

27. The method of claim 22 wherein the first, second, third and fourth substrates are semiconductor substrates, and the method further comprises manufacturing a transistor region in at least one of the first, second, third and fourth substrates before bonding of the first and second contacts.

28. The method of claim 22 wherein the first, second and third substrates are semiconductor substrates, and the method further comprises manufacturing a transistor region in each of the first, second, third and fourth substrates before bonding of the first and second contacts.

29. The method of claim 22 wherein attaching the first side of the first substrate to the first side of the second substrate comprises bonding one or more contacts on the first side of the first substrate to one or more contacts on the first side of the second substrate.

* * * * *

UNITED STATES PATENT AND TRADEMARK OFFICE
CERTIFICATE OF CORRECTION

PATENT NO. : 6,322,903 B1
DATED : November 27, 2001
INVENTOR(S) : Oleg Siniaguine and Sergey Savastiouk It is certified that error appears in the above-identified patent and that said Letters Patent is hereby corrected as shown below:

Column 11,
Line 35, after "processing the", change "first" to -- second --.

Signed and Sealed this

First Day of April, 2003

JAMES E. ROGAN
*Director of the United States Patent and Trademark Office*